(12) United States Patent
McShane et al.

(10) Patent No.: US 10,613,936 B2
(45) Date of Patent: Apr. 7, 2020

(54) FRACTIONAL SLICES IN A DISTRIBUTED STORAGE SYSTEM

(71) Applicant: International Business Machines Corporation, Armonk, NY (US)

(72) Inventors: Niall J. McShane, Arlington Heights, IL (US); Jason K. Resch, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 76 days.

(21) Appl. No.: 16/053,395

(22) Filed: Aug. 2, 2018

(65) Prior Publication Data

US 2018/0341550 A1     Nov. 29, 2018

Related U.S. Application Data

(63) Continuation-in-part of application No. 15/827,073, filed on Nov. 30, 2017, now Pat. No. 10,089,036, (Continued)

(51) Int. Cl.
*G06F 15/167* (2006.01)
*G06F 11/10* (2006.01)
(Continued)

(52) U.S. Cl.
CPC .......... *G06F 11/1076* (2013.01); *G06F 3/064* (2013.01); *G06F 3/065* (2013.01);
(Continued)

(58) Field of Classification Search
None
See application file for complete search history.

(56) References Cited

U.S. PATENT DOCUMENTS

| | | | |
|---|---|---|---|
| 4,092,732 | A | 5/1978 | Ouchi |
| 5,454,101 | A | 9/1995 | Mackay et al. |
| (Continued) | | | |

OTHER PUBLICATIONS

Chung; An Automatic Data Segmentation Method for 3D Measured Data Points; National Taiwan University; pp. 1-8; 1998.
(Continued)

*Primary Examiner* — Phuoc H Nguyen
(74) *Attorney, Agent, or Firm* — Garlick & Markison; Randy W. Lacasse

(57) ABSTRACT

A method for a dispersed storage network (DSN) begins by encoding a data segment of data to produce a set of encoded data slices including an information dispersal algorithm (IDA) width number of encoded data slices. The method continues by determining a number of storage locations, where the number of storage locations is less than the IDA width number, combining, for each storage location, a portion of at least two encoded data slices of the set of encoded data slices to produce a combined slice and sending the combined slice to the storage location for storage. When retrieving the data, the method includes combining slices associated with a set of encoded data slices, de-combining the combined slice, aggregating portions of common encoded data slices and decoding a decode threshold number of the encoded data slices of the set of encoded data slices to produce a recovered data segment.

20 Claims, 6 Drawing Sheets

Related U.S. Application Data which is a continuation-in-part of application No. 14/721,838, filed on May 26, 2015, now Pat. No. 9,841,925.

(60) Provisional application No. 62/031,342, filed on Jul. 31, 2014.

(51) Int. Cl.
| | |
|---|---|
| *H04L 29/08* | (2006.01) |
| *G06F 3/06* | (2006.01) |
| *H03M 13/29* | (2006.01) |
| *H03M 13/37* | (2006.01) |
| *H03M 13/15* | (2006.01) |

(52) U.S. Cl.
CPC ............ *G06F 3/067* (2013.01); *G06F 3/0619* (2013.01); *H03M 13/2906* (2013.01); *H04L 67/1097* (2013.01); *H03M 13/1515* (2013.01); *H03M 13/3761* (2013.01)

(56) References Cited

U.S. PATENT DOCUMENTS

| | | | |
|---|---|---|---|
| 5,485,474 | A | 1/1996 | Rabin |
| 5,774,643 | A | 6/1998 | Lubbers et al. |
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 8,275,744 | B2 | 9/2012 | Baptist et al. |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula |
| 2005/0132070 | A1 | 6/2005 | Redlich et al. |
| 2005/0144382 | A1 | 6/2005 | Schmisseur |
| 2005/0229069 | A1 | 10/2005 | Hassner et al. |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2011/0106972 | A1 | 5/2011 | Grube et al. |
| 2012/0054556 | A1* | 3/2012 | Grube .................. G06F 3/0619 714/42 |
| 2012/0089809 | A1 | 4/2012 | Resch et al. |
| 2012/0311068 | A1 | 12/2012 | Gladwin et al. |
| 2013/0110962 | A1 | 5/2013 | Grube et al. |
| 2013/0111166 | A1 | 5/2013 | Resch et al. |
| 2013/0151670 | A1 | 6/2013 | Leggette et al. |
| 2013/0275480 | A1 | 10/2013 | Dhuse et al. |
| 2013/0290482 | A1 | 10/2013 | Leggette |
| 2014/0330921 | A1 | 11/2014 | Storm et al. |
| 2015/0193309 | A1* | 7/2015 | Khadiwala .......... G06F 11/1435 714/4.11 |
| 2015/0381731 | A1 | 12/2015 | Grube et al. |
| 2018/0124176 | A1* | 5/2018 | McShane ................ H04L 69/40 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): String Representation of Search Filters; IETF Network Working Group; RFC 4515; Jun. 2006; pp. 1-12.

Smith; Lightweight Directory Access Protocol (LDAP): Uniform Resource Locator; IETF Network Working Group; RFC 4516; Jun. 2006; pp. 1-15.

(56) References Cited

OTHER PUBLICATIONS

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

\* cited by examiner

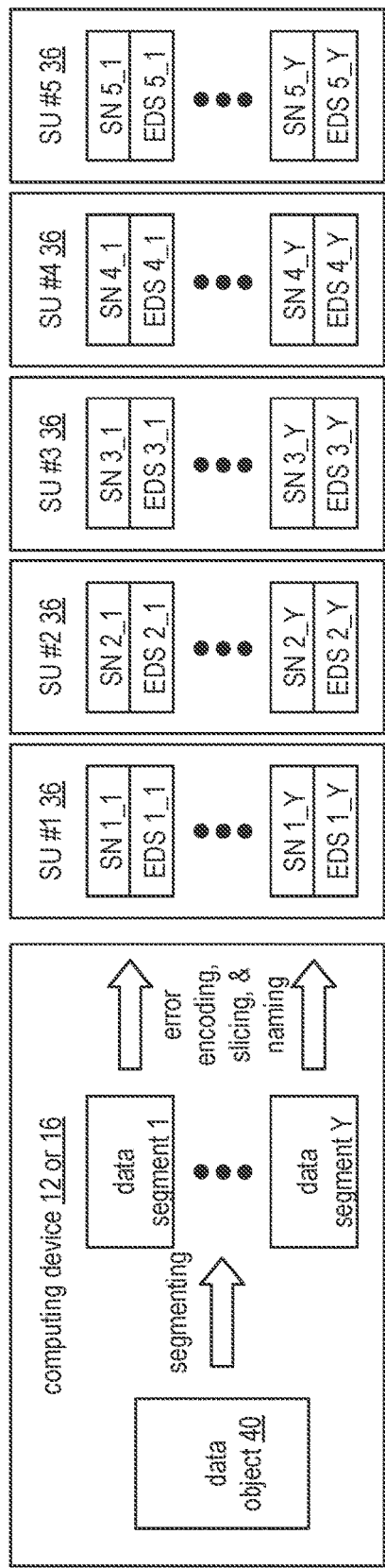
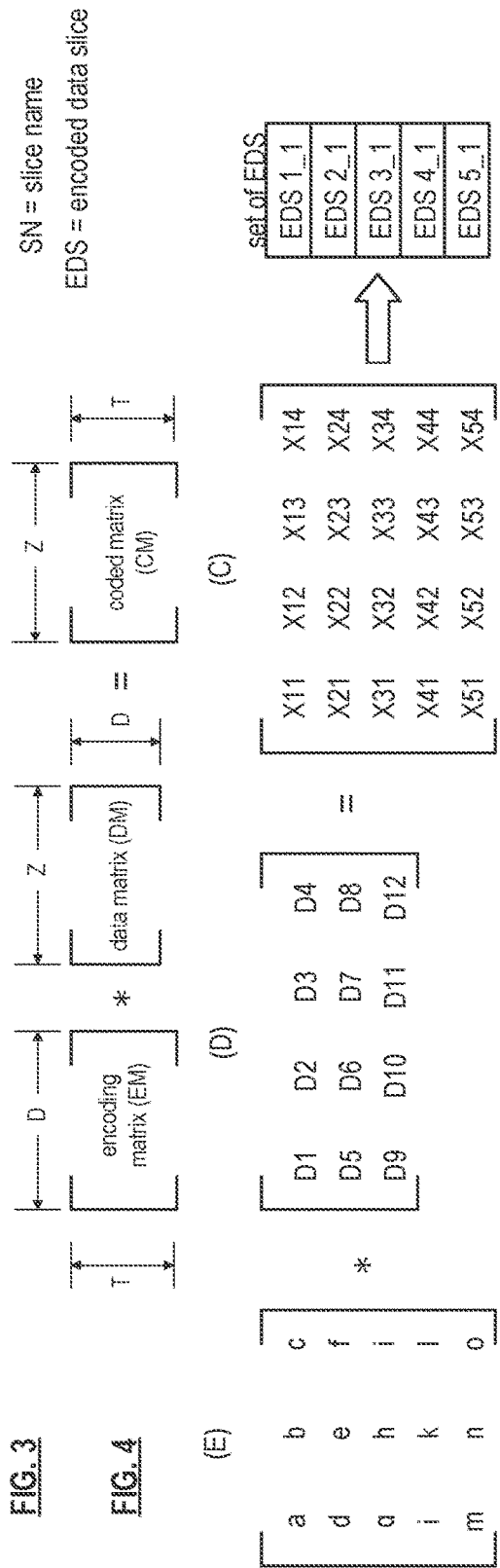
FIG. 3
FIG. 4
FIG. 5
FIG. 6

FRACTIONAL SLICES IN A DISTRIBUTED STORAGE SYSTEM

CROSS-REFERENCE TO RELATED APPLICATIONS

The present U.S. Utility patent application claims priority pursuant to 35 U.S.C. § 120 as a continuation-in-part of U.S. Utility application Ser. No. 15/827,073, entitled "MIGRATING DATA IN A DISTRIBUTED STORAGE NETWORK", filed Nov. 30, 2017, which is a continuation-in-part of U.S. Utility application Ser. No. 14/721,838, entitled "ADJUSTING TIMING OF STORING DATA IN A DISPERSED STORAGE NETWORK", filed May 26, 2015, now issued as U.S. Pat. No. 9,841,925 on Dec. 12, 2017, which claims priority pursuant to 35 U.S.C. § 119(e) to U.S. Provisional Application No. 62/031,342, entitled "DISPERSED STORAGE NETWORK STORAGE RETRY MECHANISM", filed Jul. 31, 2014, all of which are hereby incorporated herein by reference in their entirety and made part of the present U.S. Utility patent application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
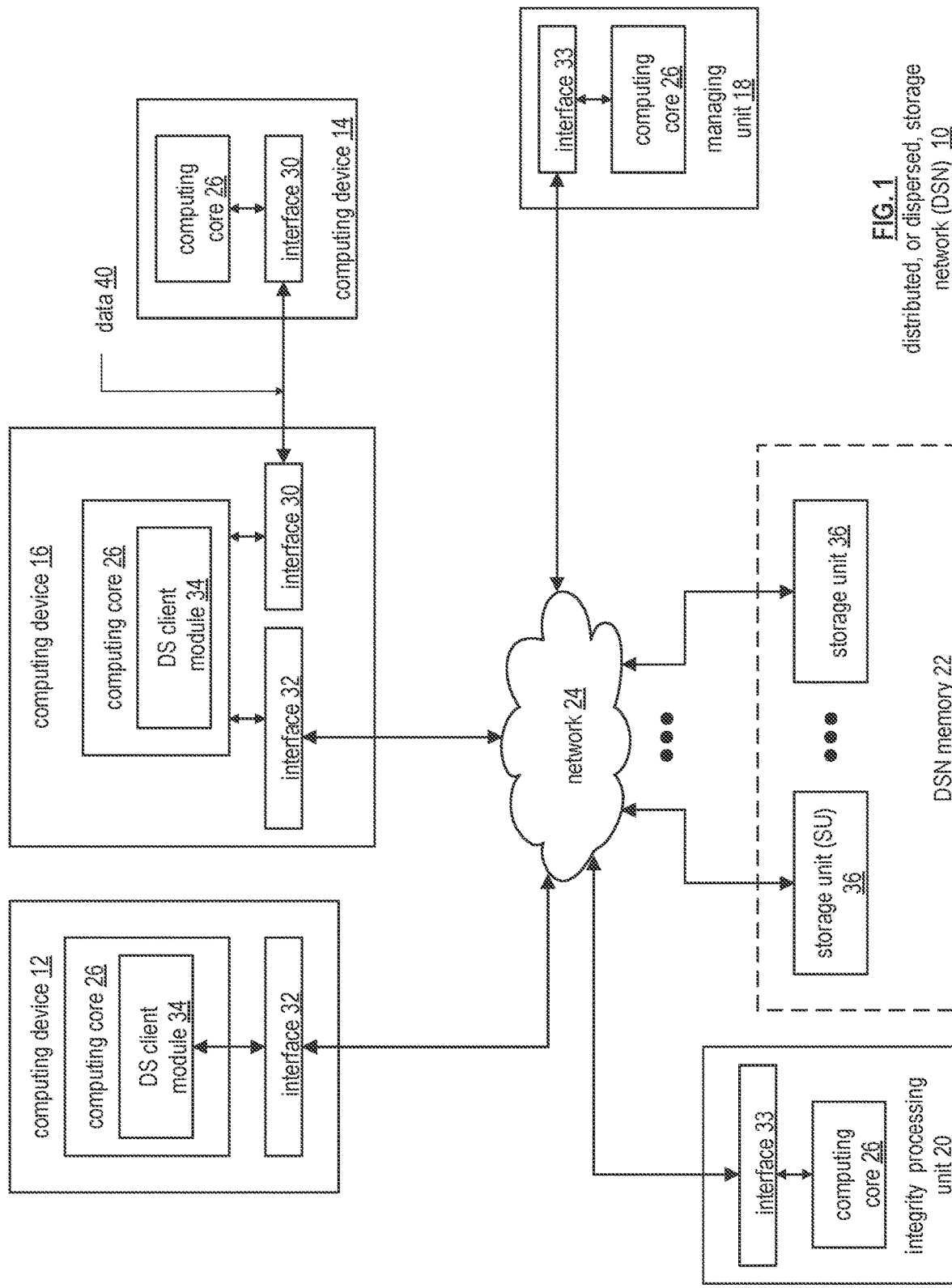
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
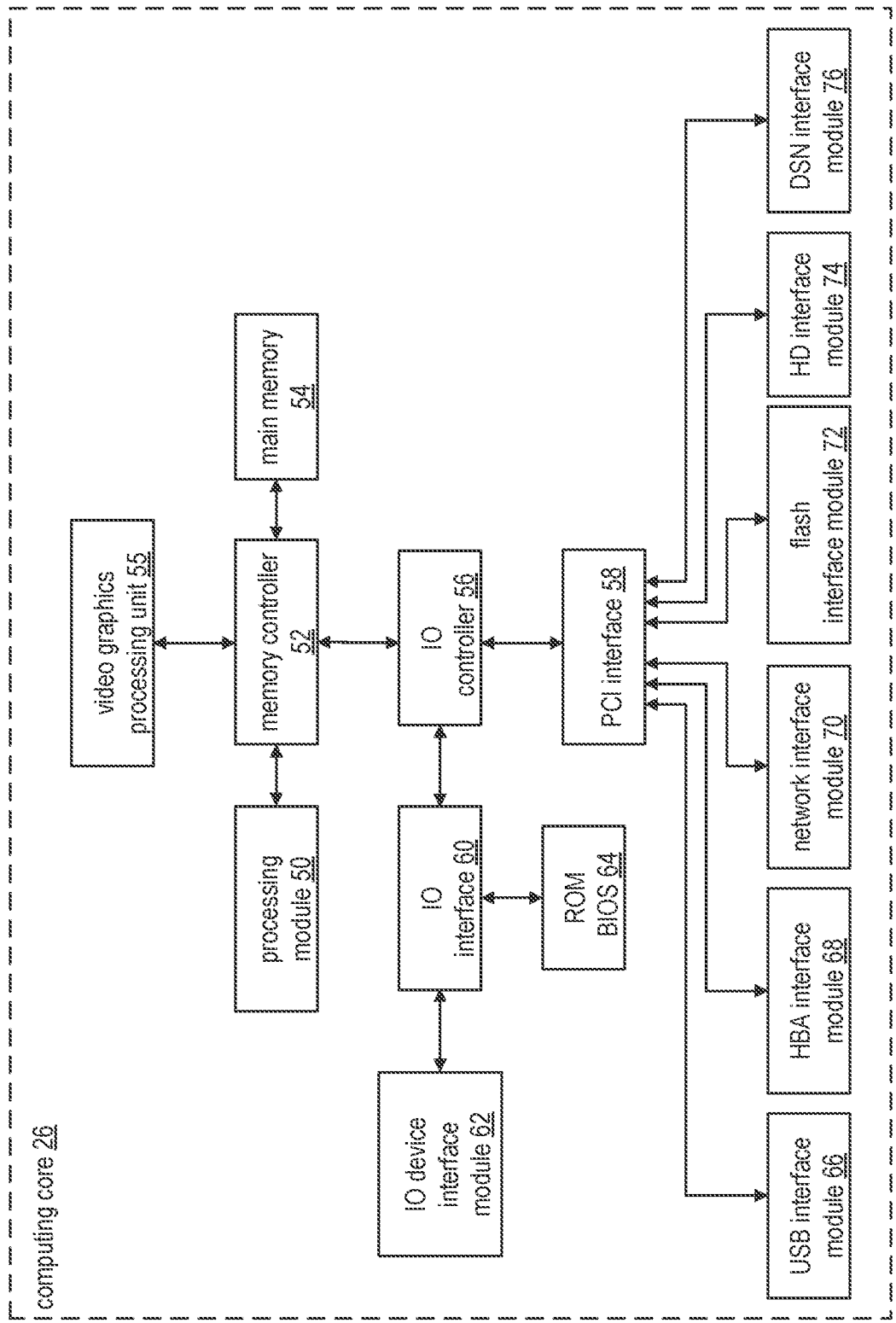
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-9B. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate per-access billing information. In another instance, the DSN managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
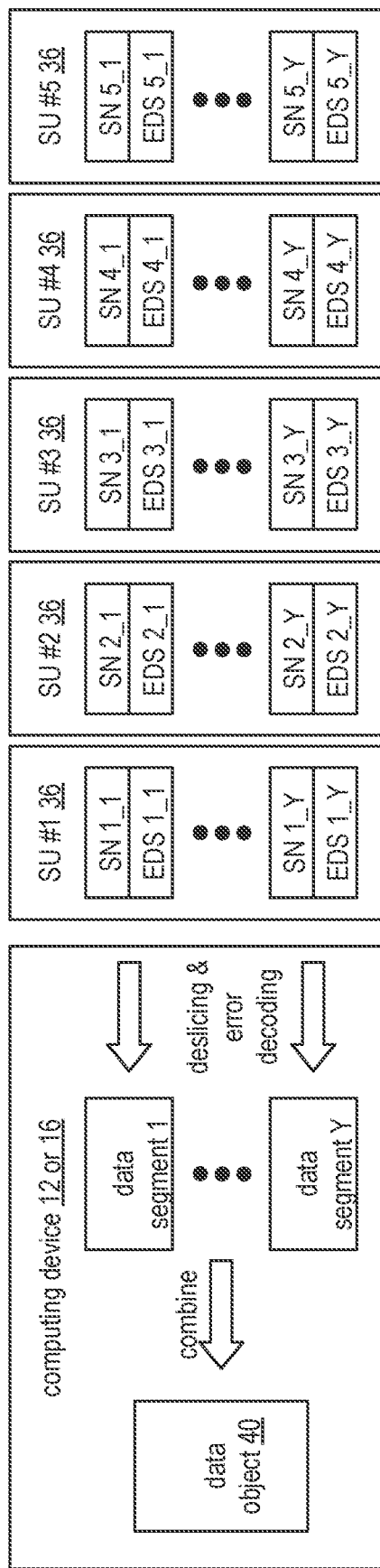
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
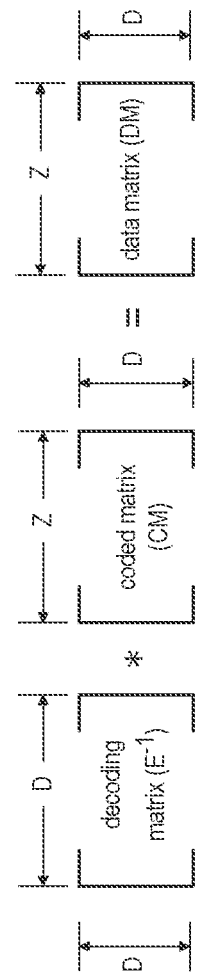
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

In cases where width of a DSN memory is constrained, such that the number of storage locations available is less than the width (or width is kept a smaller than ideal number), it can result in inadequate reliability and availability characteristics. To better accommodate these cases, in one embodiment described in greater detail in association with FIGS. 9A and 9B, a DS processing unit might still generate a higher width number of slices, but then store non-integer fractions of those slices across the smaller set of devices. For example, consider a case of IDA width=12, number of devices=8. Rather than use an IDA width of 8, the DS processing unit computes 12 slices. However, before dispersing the slices, the DS processing unit divides up the slices such that each DS unit receives 3/2 of a slice. Each slice may be split in half to produce 24 half slices from the original 12 produced by the IDA. Now each of the 8 DS units can receive 3 half-slices. In the future, should new DS units be added, or the system expanded, these half-slices may be recomposed into traditional full slices.

In addition, each DS unit may distribute the half slices across different memory devices to increase reliability (or concatenate and store them together to reduce seeks and increase performance).

Figure 9A:
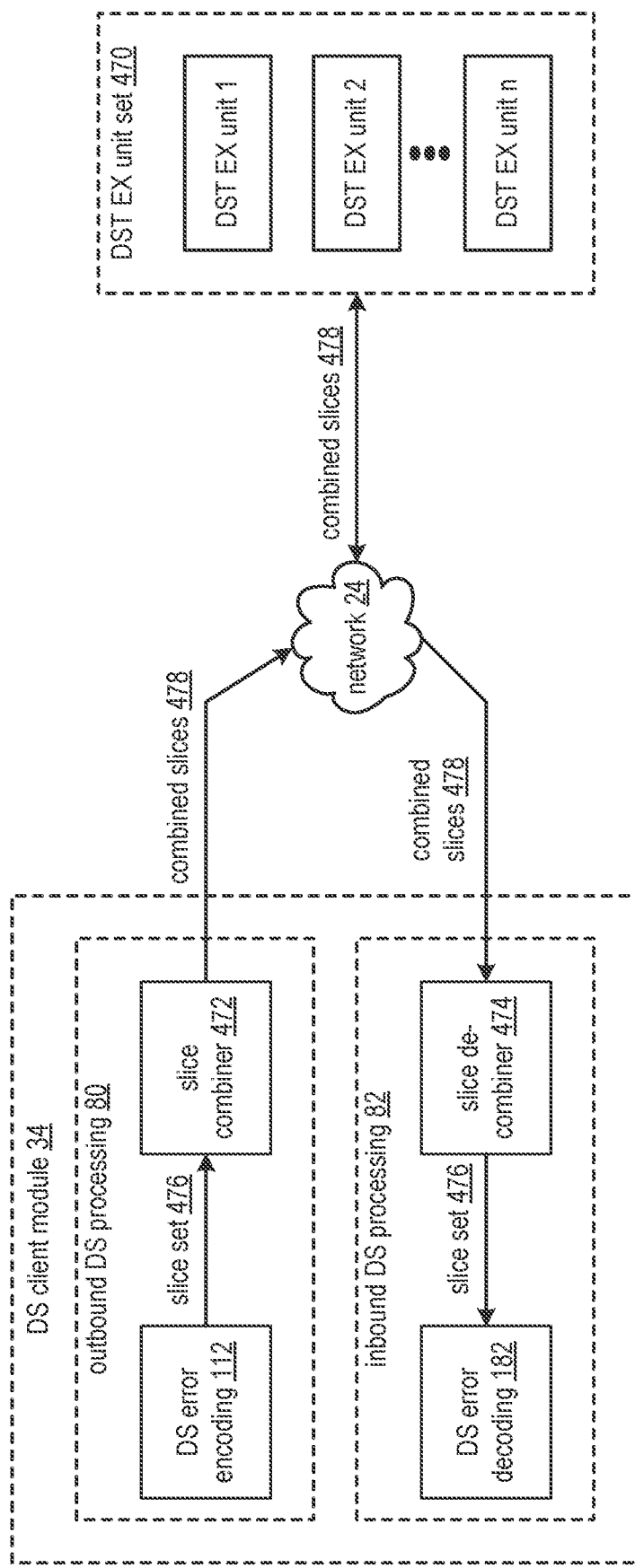
FIG. 9A is a schematic block diagram of a fractional slice embodiment of a dispersed storage network (DSN) in accordance with the present invention.

FIG. 9A is a schematic block diagram of another embodiment of a dispersed storage network (DSN) that includes a distributed storage (DS) client module 34 of FIG. 1, the network 24 of FIG. 1, and a DS execution unit set 470. The DS client module 34 includes outbound DS processing 80 (FIGS. 3-6) and inbound DS processing 82 (FIGS. 7-8). Outbound DS processing 80 includes dispersed storage (DS) error encoding and a slice combiner 472. Inbound DS processing 82 includes DS error decoding 182 and a slice de-combiner 474. The DST execution unit set 470 includes a set of DST execution units 1-n. Each DST execution unit may be implemented utilizing a Storage Unit (SU) 36 of FIG. 1.

The DSN functions to access stored data. In an example of operation of the accessing of the stored data, the DS error encoding 112 dispersed storage error encodes a data segment of data in accordance with dispersal parameters to produce a set of encoded data slices 476. The dispersal parameters include one or more of an information dispersal algorithm (IDA) width, a decode threshold number, or an identifier of an encoding matrix. For example, the DS error encoding 112 utilizes dispersal parameters that includes an IDA width of 12 based on a system registry lookup for a vault associated with the data.

Slice combiner 472 determines a number of storage locations for storage of the set of encoded data slices. The determining may be based on one or more of initiating a query, receiving a query response, performing a lookup, and receiving storage location instructions. For example, the slice combiner 472 determines to utilize eight storage locations when the DST execution unit set includes eight DST execution units 1-8. For instance, the number of storage locations is less than the IDA width when the number of storage locations is eight and the IDA width is 12.

Having determined the number of storage locations, for each storage location, the slice combiner 472 combines a portion of at least two encoded data slices to produce a combined slice 478 for storage at the storage location in accordance with a combining approach when the number of storage locations is less than the IDA width. The combining approach includes one of an even distribution, a weighted distribution, and a predetermined distribution. For example, the slice combiner 472 combines halves of encoded data slices such that each storage location will receive three halves of an encoded data slice when the IDA width is 12 and the number of storage locations is eight. For instance, the slice combiner combines both halves of encoded data slice 1 with a first half of encoded data slice 2 to produce a first combined slice, combines a second half of encoded data slice 2 with both halves of encoded data slice 3 to produce a second combined slice, etc. Many other such combinations are possible.

For each combined slice, the outbound DS processing 80 sends, via the network 24, the combined slice 478 to the corresponding DST execution unit for storage. For example, the outbound DS processing 80 generates a write slice request that includes the first combined slice and sends, via the network 24, the first combined slice to the DST execution unit 1 for storage. The generating of the write request may further include generating one or more slice names associated with the at least two encoded data slices utilized to produce the combined slice.

When retrieving the data, the inbound DS processing 82 receives combined slices 478 from the DST execution unit set. For example, the inbound DS processing 82 issues, via the network 24, read slice requests to the DST execution unit set and extracts the combined slices 478 from received read slice responses. For each received combined slice, the slice de-combiner 474 performs a de-combiner function on the received combined slice to reproduce the portions of the at least two encoded data slices.

Having produced the portions of the at least two encoded data slices, the slice de-combiner 474 aggregates portions of combined encoded data slices to reproduce the set of encoded data slices 476. Alternatively, the slice de-combiner produces at least a decode threshold number of encoded data slices of the set of encoded data slices. DS error decoding 182 dispersed storage error decodes the decode threshold number of encoded data slices of the reproduced set of encoded data slices 476 to produce a recovered data segment.

Figure 9B:
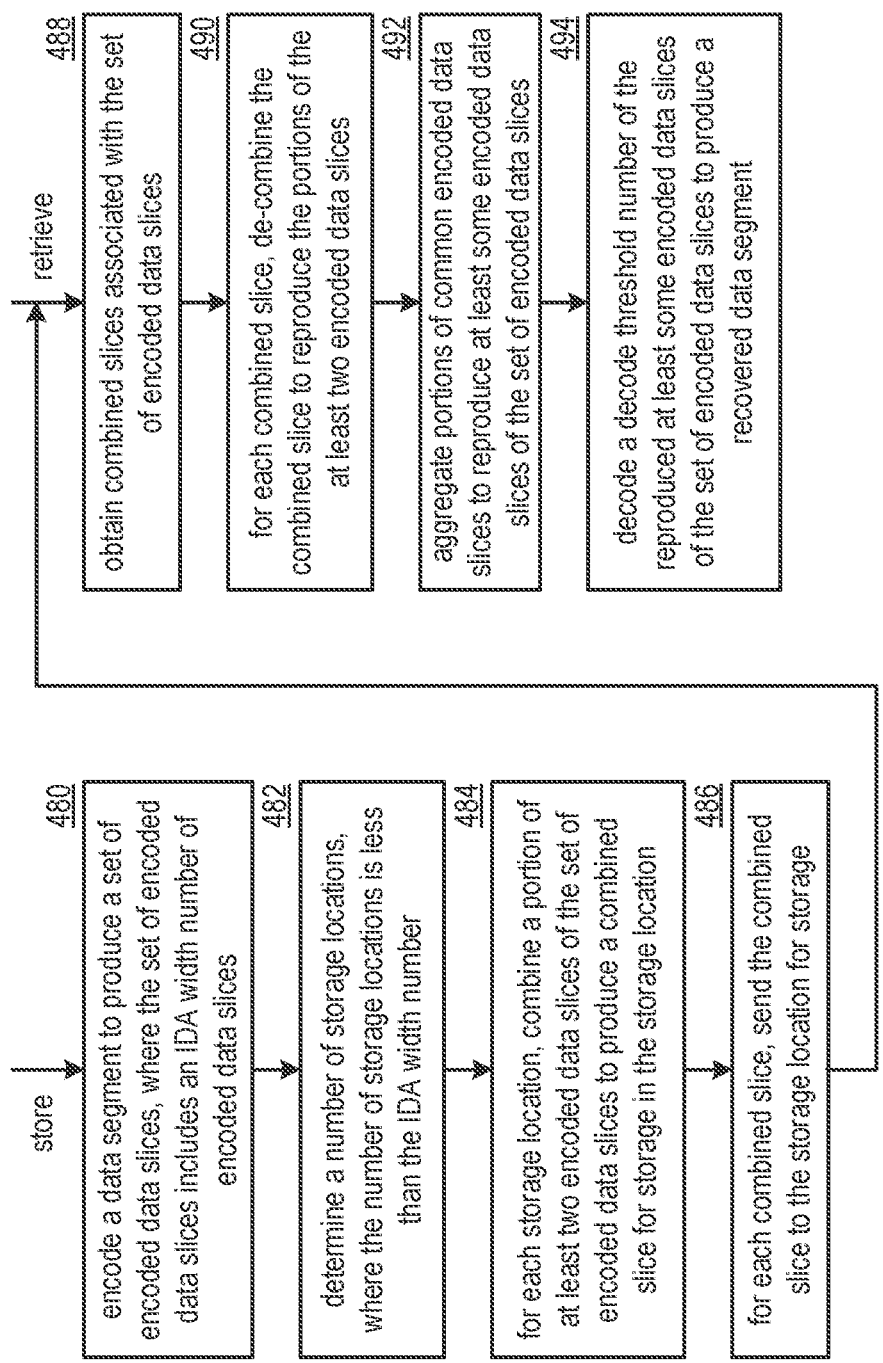
FIG. 9B is a flowchart illustrating an example of a fractional slice embodiment in accordance with the present invention.

FIG. 9B is a flowchart illustrating an example of accessing stored data. The method begins or continues at step 480 where a processing module (e.g., of a distributed storage (DS) client module), when storing data, encodes a data segment of data to produce a set of encoded data slices, where the set of encoded data slices includes an information dispersal algorithm (IDA) width number of encoded data slices. The method continues at step 482 where the processing module determines a number of storage locations, where the number of storage locations is less than the IDA width number. The determining includes at least one of interpreting a system registry, initiating a query, or interpreting a query response.

For each storage location, the method continues at step 484 where the processing module combines a portion of at least two encoded data slices of the set of encoded data slices to produce a combined slice for storage in the storage location. The combining is in accordance with a combining approach. For each combined slice, the method continues at step 486 where the processing module sends the combined slice to the storage location for storage.

When retrieving the data, the method continues at step 488 where the processing module obtains combined slices associated with a set of encoded data slices. For example, the processing module issues read slice requests to the storage locations, where the read slice requests includes slice names associated with the portions of the encoded data slices, and receives read slice responses that include the combined slices. In a typical IDA, all slices are equivalent and so a threshold number of slices from any T storage locations would typically be selected based on fastest response time using, for example, a read ranking algorithm. However, in this embodiment, since each location contains portions of slices, the system may need to read combined slices from logically adjacent storage locations in order to retrieve all of the portions of a given slice.

A similar consideration may also apply when writing combined slices, particularly in a geo-dispersed scenario. Since network outages are more likely to impact availability of slices in a particular site within a multi-site deployment, the algorithm for combining slices should ensure that all slices are fully contained within a single site. So, for example, if writing slices using an IDA with a width of 36 to 12 devices located in 3 sites, the algorithm should ensure that slices 1-12 are combined in such a way that they are written to 4 devices in site 1, slices 13-24 are combined and written to 4 devices in site 2, and slices 25-36 are combined and written to 4 devices in site 3.

For each combined slice, the method continues at step 490 where the processing module de-combines the combined slice to reproduce the portions of the at least two encoded data slices. For example, the processing module de-combines the combined slice in accordance with the combining approach to reproduce the portions of the at least two encoded data slices.

The method continues at 492 where the processing module aggregates portions of common encoded data slices to reproduce at least some encoded data slices of the set of encoded data slices. The method continues at step 494 where the processing module decodes a decode threshold number of the reproduced at least some encoded data slices of the set of encoded data slices to produce a recovered data segment.

The method described above in conjunction with the processing module can alternatively be performed by other modules of the dispersed storage network or by other computing devices. In addition, at least one memory section (e.g., a non-transitory computer readable storage medium) that stores operational instructions can, when executed by one or more processing modules of one or more computing devices of the dispersed storage network (DSN), cause the one or more computing devices to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the method comprises:
   encoding a data segment of data to produce a set of encoded data slices, where the set of encoded data slices includes an information dispersal algorithm (IDA) width number of encoded data slices;
   determining a number of storage locations, where the number of storage locations is less than the IDA width number;
   combining, for each storage location, a portion of at least two encoded data slices of the set of encoded data slices to produce a combined slice for storage in the storage location; and
   sending the combined slice to the storage location for storage.

2. The method of claim 1, wherein the sending the combined slice to the storage location for storage includes storing all portions of an encoded slice in a single DSN storage site.

3. The method of claim 1, wherein the determining a number of storage locations includes at least one of: interpreting a system registry, initiating a query, or interpreting a query response.

4. The method of claim 1 further comprises, when retrieving the data:
  retrieving the combined slices associated with a set of encoded data slices to include reading from logically adjacent storage locations; and
  for each combined slice, de-combining the combined slice to reproduce the portions of the at least two encoded data slices;
  aggregating portions of common encoded data slices to reproduce at least some encoded data slices of the set of encoded data slices; and
  decoding a decode threshold number of the reproduced at least some encoded data slices of the set of encoded data slices to produce a recovered data segment.

5. The method of claim 4, wherein the combining, for each storage location, a portion of at least two encoded data slices of the set of encoded data slices to produce a combined slice for storage in the storage location includes a combining approach and the de-combining the combined slice is in accordance with the combining approach to reproduce the portions of the at least two encoded data slices.

6. The method of claim 5, wherein the combining approach includes one of: an even distribution, a weighted distribution, or a predetermined distribution.

7. The method of claim 1, wherein retrieving the combining slices associated with a set of encoded data slices includes issuing read slice requests to the storage locations, where the read slice requests includes slice names associated with the portions of the encoded data slices, and receiving read slice responses that includes the combined slices.

8. A computing device of a group of computing devices of a dispersed storage network (DSN), the computing device comprises:
  an interface;
  a local memory; and
  a processing module operably coupled to the interface and the local memory, wherein the processing module functions to:
    encode a data segment of data to produce a set of encoded data slices, where the set of encoded data slices includes an information dispersal algorithm (IDA) width number of encoded data slices;
    determine a number of storage locations, where the number of storage locations is less than the IDA width number;
    combine, for each storage location, a portion of at least two encoded data slices of the set of encoded data slices to produce a combined slice for storage in the storage location; and
    send the combined slice to the storage location for storage.

9. The computing device of claim 8, wherein the sending the combined slice to the storage location for storage includes storing all portions of an encoded slice in a single DSN storage site.

10. The computing device of claim 8, wherein the determine a number of storage locations includes at least one of interpreting a system registry, initiating a query, or interpreting a query response.

11. The computing device of claim 8, wherein the processing module is further configured to, when retrieving the data:
  retrieve the combined slices associated with a set of encoded data slices to include reading from logically adjacent storage locations; and
  for each combined slice, de-combine the combined slice to reproduce the portions of the at least two encoded data slices;
  aggregate portions of common encoded data slices to reproduce at least some encoded data slices of the set of encoded data slices; and
  decode a decode threshold number of the reproduced at least some encoded data slices of the set of encoded data slices to produce a recovered data segment.

12. The computing device of claim 11, wherein the combine, for each storage location, a portion of at least two encoded data slices of the set of encoded data slices to produce a combined slice for storage in the storage location includes a combining approach and the de-combine the combined slice is in accordance with the combining approach to reproduce the portions of the at least two encoded data slices.

13. The computing device of claim 12, wherein the combining approach includes one of: an even distribution, a weighted distribution, or a predetermined distribution.

14. The computing device of claim 8, wherein retrieving the combined slices associated with a set of encoded data slices includes issuing read slice requests to the storage locations, where the read slice requests includes slice names associated with the portions of the encoded data slices, and receiving read slice responses that includes the combined slices.

15. A dispersed storage network (DSN) system comprises:
  a plurality of DSN storage units;
  a dispersed storage client module including:
    an interface;
    a local memory; and
    a processing module operably coupled to the interface and the local memory, wherein the processing module functions to:
      encode a data segment of data to produce a set of encoded data slices, where the set of encoded data slices includes an information dispersal algorithm (IDA) width number of encoded data slices;
      determine a number of storage locations, where the number of storage locations is less than the IDA width number;
      combine, for each storage location, a portion of at least two encoded data slices of the set of encoded data slices to produce a combined slice for storage in the storage location; and
      send the combined slice to a corresponding one of the plurality of DSN storage units at the storage location for storage.

16. The DSN system of claim 15, wherein the send the combined slice to a corresponding one of the plurality of DSN storage units at the storage location for storage includes storing all portions of an encoded slice in a single DSN storage site.

17. The DSN system of claim 15, wherein the determine a number of storage locations includes at least one of interpreting a system registry, initiating a query, or interpreting a query response.

18. The DSN system of claim 15, wherein the processing module is further configured to, when retrieving the data:
  retrieve the combined slices associated with a set of encoded data slices to include reading from logically adjacent storage locations; and
  for each combined slice, de-combine the combined slice to reproduce the portions of the at least two encoded data slices;

aggregate portions of common encoded data slices to reproduce at least some encoded data slices of the set of encoded data slices; and decode a decode threshold number of the reproduced at least some encoded data slices of the set of encoded data slices to produce a recovered data segment.

19. The DSN system of claim 18, wherein the combine, for each storage location, a portion of at least two encoded data slices of the set of encoded data slices to produce a combined slice for storage in the storage location includes a combining approach and the de-combine the combined slice is in accordance with the combining approach to reproduce the portions of the at least two encoded data slices.

20. The DSN system of claim 15, wherein the retrieve the combined slices associated with a set of encoded data slices includes issuing read slice requests to the storage locations, where the read slice requests includes slice names associated with the portions of the encoded data slices, and receiving read slice responses that includes the combined slices.

* * * * *